(12) United States Patent
Scheiner et al.

(10) Patent No.: US 6,556,947 B1
(45) Date of Patent: Apr. 29, 2003

(54) OPTICAL MEASUREMENTS OF PATTERNED STRUCTURES

(75) Inventors: David Scheiner, Ganei-Yehuda (IL); Avi Ravid, Kfar-Saba (IL)

(73) Assignee: Nova Measuring Instruments Ltd., Rehovot (IL)

( * ) Notice: Subject to any disclaimer, the term of this patent is extended or adjusted under 35 U.S.C. 154(b) by 8 days.

(21) Appl. No.: 09/695,838

(22) Filed: Oct. 26, 2000

(30) Foreign Application Priority Data

Oct. 28, 1999 (IL) ................................................ 132639

(51) Int. Cl.$^7$ .............................................. G01B 11/02
(52) U.S. Cl. ....................................................... 702/172
(58) Field of Search ................................ 356/630, 632, 356/485, 357; 702/81, 83, 170, 172; 364/560; 250/339.11

(56) References Cited

U.S. PATENT DOCUMENTS

| | | | |
|---|---|---|---|
| 5,889,592 A | | 3/1999 | Zawaideh |
| 5,900,633 A | * | 5/1999 | Solomon et al. ........ 250/339.08 |
| 5,963,329 A | | 10/1999 | Conrad et al. |
| 6,100,985 A | * | 8/2000 | Scheiner et al. ......... 250/341.1 |
| 6,242,739 B1 | * | 6/2001 | Cherkassky ............ 250/339.08 |

FOREIGN PATENT DOCUMENTS

| | | |
|---|---|---|
| EP | 0 718 595 | 6/1996 |
| WO | 99 54679 | 10/1999 |

* cited by examiner

Primary Examiner—John Barlow
Assistant Examiner—Anthony Dougherty
(74) Attorney, Agent, or Firm—Browdy and Neimark, P.L.L.C.

(57) ABSTRACT

A method for measuring at least one desired characteristic of a patterned article is presented. The article is of a kind containing a plurality of different pattern elements located at different sites, each including a stack of layers. An optical model is provided, which is based on a set of parameters corresponding to predetermined characteristics of the article, and is capable of generating theoretical data indicative of spectral response of the article. The set of parameters includes parameters corresponding to geometrical characteristics of the pattern elements. Reference data is prepared containing a plurality of sets of parameters for at least some of the different pattern elements. A spectral measurement of light response is carried out at a selected site of the patterned article and measured data is generated. By varying said parameters' sets, the optical model is optimized, and then the theoretical spectral responses obtained through the optimized optical model and from the measured data is analyzed to determine therefrom the at least one desired characteristic.

42 Claims, 4 Drawing Sheets

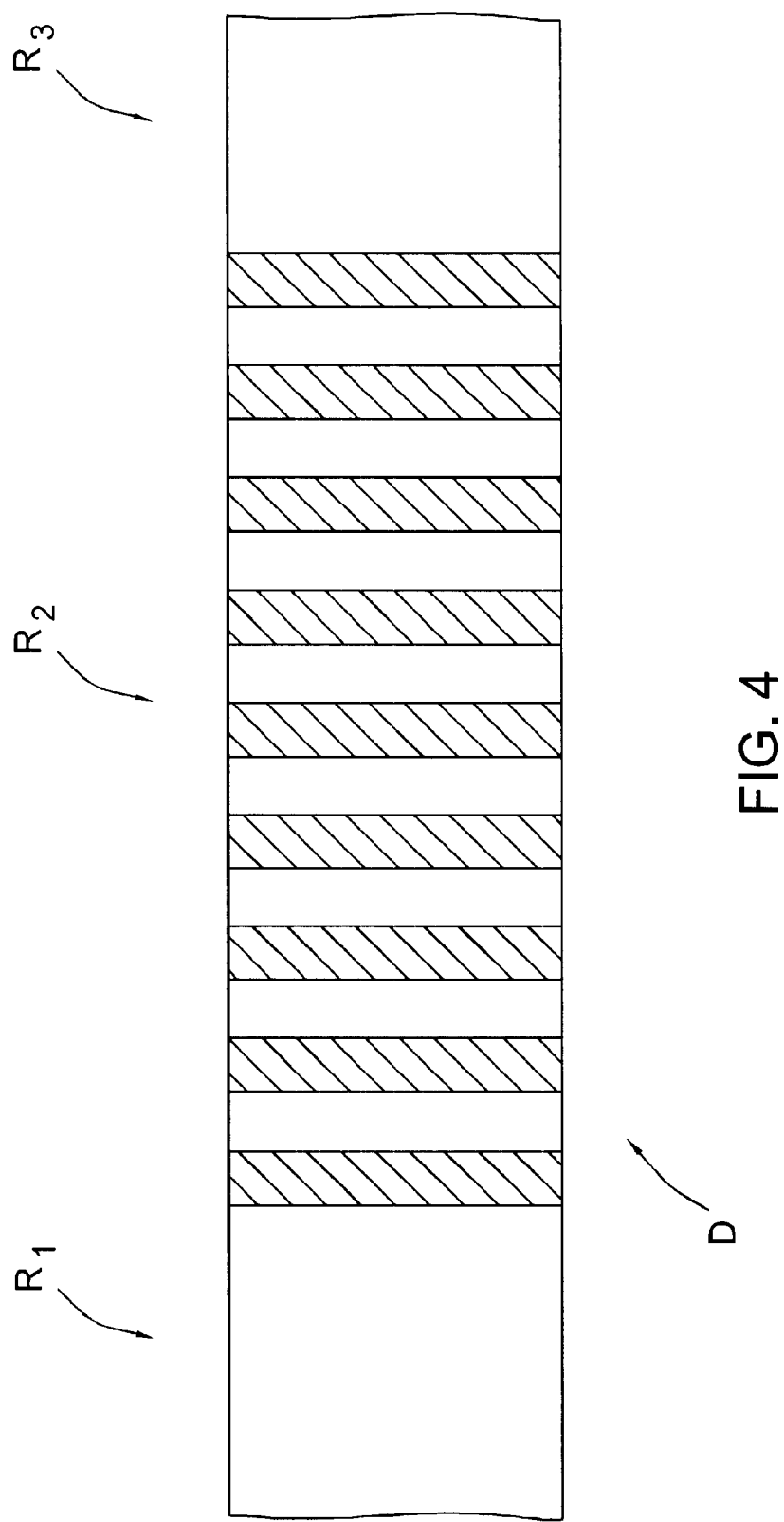

OPTICAL MEASUREMENTS OF PATTERNED STRUCTURES

FIELD OF THE INVENTION

This invention is generally in the field of optical measurement techniques, and relates to a method and system for film characteristics measurements in patterned structures. The invention is particularly useful in the manufacture of semiconductor devices.

BACKGROUND OF THE INVENTION

A semiconductor wafer presents a patterned article, the pattern being in the form of multiple-layer stacks. Various manufacturing steps in the manufacture of semiconductor devices require measurements of thickness or other characteristics of an uppermost or other layer of a semiconductor wafer.

Usually, the thickness measurements are carried out on predetermined sites on the wafer, each containing a known layer stack, after performing wafer alignment utilizing a so called "alignment feature". In other words, the knowledge of the layers' materials and thicknesses in the stack undergoing measurements, and the location of the alignment feature, are two inherent conditions, constituting the so-called "recipe design", for performing the thickness measurements. The alignment feature is a unique feature (pattern element) which is present in each of the wafer dies. To locate the alignment feature, a suitable pattern recognition technique is used, which location includes coordinates of the alignment feature and its relative location to any selected site (i.e., the die's dimensions and the space between two locally adjacent dies). This enables location of each site to be measured relative to the alignment feature.

Unfortunately, in cases when such a recipe design cannot be automatically prepared on-line, i.e., concurrently with the measurement procedure, the wafer is removed from the production line, and the entire process is stopped waiting for the off-line preparation of the recipe design.

Attempts have been made for eliminating the need for recipe design automatic preparation and pattern recognition required therefor. U.S. Pat. No. 5,900,633 discloses a measurement technique, which utilizes a "larged spot (measurement area) illumination (1–10 mm). This technique enables to obtain an average thickness value and does not provide for local measurements of each feature within the spot.

SUMMARY OF THE INVENTION

There is accordingly a need in the art to facilitate measurements in patterned articles by providing a novel method of optical measurements and a system for carrying out the same.

The term "patterned article" signifies an article formed with regions having different optical properties with respect to incident radiation. The regions of the wafer having non-patterned structure could be considered as a particular case of patterned structures characterized by an infinitive cycle as compared to the measurement spot diameter. It is a major feature of the present invention to provide such a method that enables the automatic (on-line) preparation of a recipe design associated with a specific article undergoing measurements. The term "recipe design" used herein signifies a computer file containing the full information required to characterize a specific site of the article. The site includes a stack of different layers, which may and may not include different locally adjacent sub-stacks (features of the pattern). The information contained in the recipe design thus includes data indicative of the layers' thickness, materials and geometric details (e.g., wafer's features dimensions), optical model(s) to be used for measurements in this site and interpretation data (algorithms), die size, alignment feature location, etc. This recipe design, once prepared, can be used for measuring one or more sites in the article to be measured.

It is a further feature of the present invention to provide such a method that enables mapping of tile layer thickness (or other characteristic) or mapping of the layer non-uniformity over the entire article or within a specific region (e.g., a region of a die) with desired, substantially high resolution (e.g., several micrometers). Such a mapping procedure does not necessarily require the recipe design to be previously prepared. On the contrary, the recipe design is prepared concurrently with the mapping procedure.

The main idea of the present invention is based on the use of a library (reference data), containing data corresponding to various sites within an article of a specific kind and/or various kinds, to optimize an optical model for performing the thickness measurements in a desired, arbitrarily chosen site. The reference data includes predefined solutions, including materials and/or layer stacks and/or geometric details for a certain process level covering as much as possible the expected variants of measurement sites that can appear at this process step. Generally speaking, the data corresponding to a specific site presents a set of the site's parameters including the following: the number of layers; optical characteristics (defined by the layer materials and thickness values), geometric characteristics (feature's dimensions), etc. The optical model includes the site's parameters as the optical model variables. By taking at least one measurement in a specific site, and analyzing the reflection spectrum obtained using at least one of the library solutions (e.g., sequentially varying the optical model and optimizing the desired parameter to be measured until a predetermined criteria is met for each of the library constituents), the measurements in this site and/or its recipe design preparation can be automatically performed. Additional adjusting of other optical model parameters, such as optical coefficients of a selected layer material, could be carried out for further optimizing the optical model.

The present invention takes advantage of the technique of optical thickness measurements in a patterned structure that has been developed and disclosed in the U.S. Pat. No. 6,100,985 assigned to the assignee of the present application. This U.S. Patent is therefore incorporated herein by reference. This technique enables a suitable optical model for thickness measurements to be applied in a corresponding article's patterned site.

Initially, the reference data including data records corresponding to each stack (site) of the article is created. The data record includes sets of the various stacks' parameters, on which the optical model is based and interpretation algorithms each for a corresponding one of the parameters' sets. The reference data is prepared by measuring a "golden" article, or other article, provided it contains all or most of the representative stack structures (or similar design rules or geometry) of the article to be measured.

It should be noted that, owing to the fact that such a multiple-layer, multiple-stack patterned article is typically manufactured layer by layer, thickness measurements are performed separately after each manufacturing step. Consequently, the reference data is designed in accordance with the manufacturing process. Usually, the data indicative of each manufacturing step (layer) is organized in subfolders or sub-directories. Thus, the reference data (libraries) includes information on each potential measurement site on the article.

The following information about each stack (site) is included in the reference data:
- algorithms suitable for performing a fitting procedure enabling calculation of the thickness or optical characteristic of uppermost or other layer(s) of the article;
- the thickness values range to be used in the fitting procedure;
- optical model geometric related parameters (characteristics), e.g., A, B, C, D and E;
- the feature width and the space between two or more adjacent features (i.e., lines and spaces);
- in the case that the site-stack is composed of locally adjacent sub-stacks, the information regarding these sub-stacks, namely materials (n and k, i.e., the index of refraction and the extinction coefficient, respectively), the nominal thickness value and its allowable tolerances towards maximal and minimal values for each layer of the sub-stack.

Thus, according to one aspect of the present invention, there is provided a method for measuring at least one desired characteristic of a patterned article containing a plurality of different pattern elements located at different sites, each including a stack of layers and presenting at least one feature of the pattern, the method comprising the steps of:
- providing an optical model based on a set of parameters corresponding to predetermined characteristics of tie article, wherein said set includes inter alia parameters corresponding to geometrical characteristics of tie pattern elements, said optical model being capable of generating theoretical data indicative of spectral response of the article;
- preparing reference data containing a plurality of sets of parameters for at least some of said different pattern elements;
- taking a spectral measurement of light response at a selected site of said patterned article and generating measured data;
- optimizing the optical model by varying said parameters' sets; and
- analyzing the theoretical spectral responses obtained through the optimization and the measured data, in order to determine therefrom said at least one desired characteristic.

The term "feature" used herein signifies at least one of the following: the dimensions of the pattern element, the space between two adjacent pattern elements and optical properties of the pattern element (defined by the layers materials and thickness).

According to another aspect of the present invention, there is provided a system for optical measuring at least one desired characteristic of a patterned article containing a plurality of pattern elements located at different sites, each including a stack of layers and presenting at least one feature of the pattern, the system comprising:
- a measuring unit including a spectrophotometer that determines spectral response of a measurement site on the article and generates spectral measured data;
- a memory for storing an optical model based on a set of parameters corresponding to predetermined characteristics of the article, wherein said set includes inter alia parameters corresponding to geometrical characteristics of the pattern elements and said optical model is capable of generating theoretical data indicative of spectral response of the article, said memory storing a reference data containing a plurality of sets of parameters for at least some of said different pattern element;
- a processing unit coupled to the measuring unit for receiving the spectral measured data, optimizing the optical model by various parameters' sets contained in the reference data, analyzing the theoretical spectral responses obtained through the optimization and the measured data, in order to determine therefrom said at least one desired characteristic.

According to still another aspect of the present invention, there is provided an optical profilometer for determining a surface profile of a patterned article containing a plurality of pattern elements located at different sites, each including a stack of layers and presenting at least one feature of the pattern, the system comprising:
- a measuring unit including a spectrophotometer that determines spectral response of a measurement site on the article and generates spectral measured data;
- a memory for storing an optical model based on a set of parameters corresponding to predetermined characteristics of the article, wherein said set includes inter alia parameters corresponding to geometrical characteristics of the pattern elements, and said optical model is capable of generating theoretical data indicative of spectral response of the article, said memory storing a reference data containing a plurality of sets of parameters for at least some of said different pattern element; and
- a processing unit coupled to the measuring unit for receiving the spectral measured data, optimizing the optical model by various parameters' sets, analyzing the theoretical spectral responses obtained through the optimization and the measured data, in order to determine therefrom the thicknesses at selected sites, and calculating the surface profile from said thicknesses.

BRIEF DESCRIPTION OF THE DRAWINGS

In order to understand the invention and to see how it may be carried out in practice, a preferred embodiment will now be described, by way of non-limiting example only, with reference to the accompanying drawings, in which:

FIG. 4 partly shows a patterned structure, illustrating the main principles of one possible example of the method according to the invention.

DETAILED DESCRIPTION OF A PREFERRED EMBODIMENT

More specifically, the present invention is used for thickness measurements (i.e., layers' thickness) of a semiconductor wafer (constituting a patterned article) and is therefore described below with respect to this application.

Figure 1A:
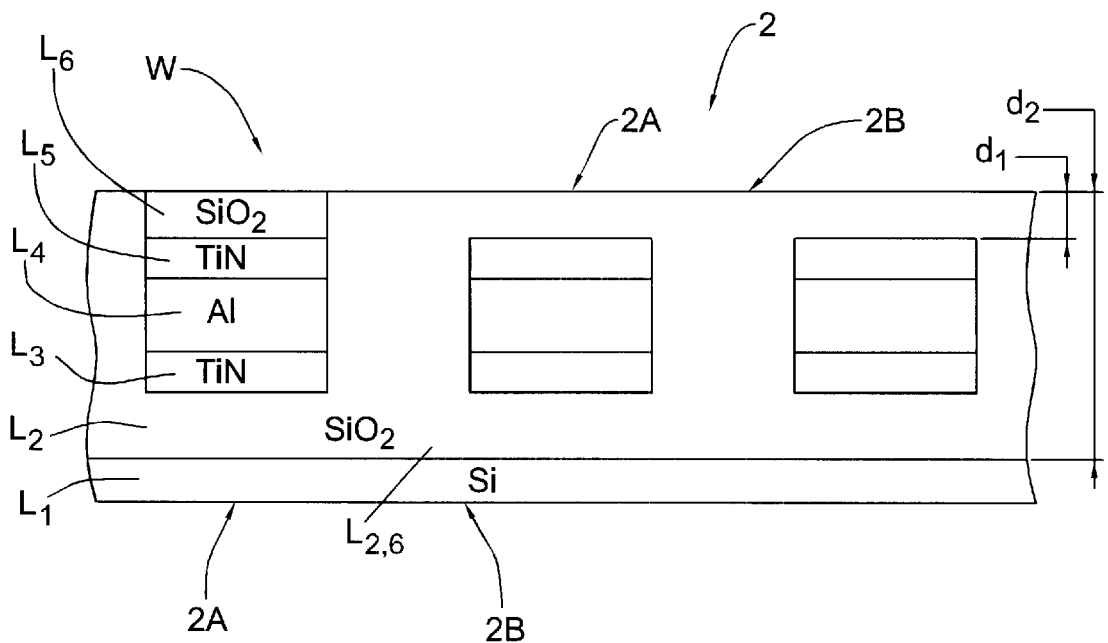
FIGS. 1A and 1B are schematic cross-sectional and top views, respectively, of a patterned structure to be measured.
Figure 1B:
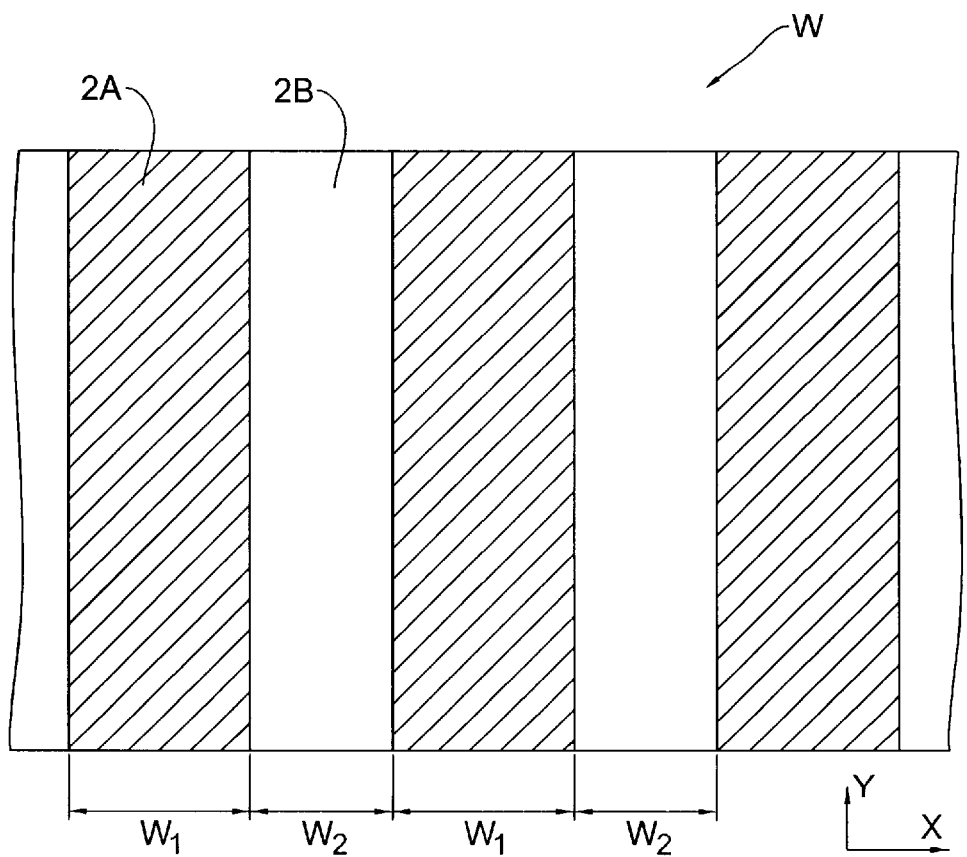

Referring to FIGS. 1A and 1B, there is partly illustrated a wafer structure, generally designated W, whose parameters are to be measured. The structure is formed of a plurality of stack 2. In the present example, the stack 2 comprises two sub-stacks 2a and 2b formed of different layers and corresponding to, respectively, a feature (pattern element) and a space between two locally adjacent features. The sub-stack 2a includes six layers $L_1$–$L_6$, wherein the layers $L_1$ and $L_2$ and the layer $L_6$ form two layers $L_1$ and $L_{2,6}$, respectively, of the stack 2b. As known in the conventional semiconductor devices, semiconductor structures such as sources, drains and gate electrodes, capacitors, etc. are formed in and on a semiconductor substrate (layer $L_1$) typically made of silicon material and including metal conductors (e.g. aluminum). The substrate is coated by an insulating silicon oxide compound (layer $L_2$). The first level metal layer $L_4$ (and the single level in the present example) is formed, being interposed between top and bottom barrier layer $L_3$ and $L_5$ made of titanium nitride (TiN). Deposition coating of an uppermost insulating silicon oxide layer $L_6$ and subsequent chemical mechanical polishing (CMP), consisting of thinning the uppermost layer $L_6$, completes the manufacturing. The construction of such a structure and method of its manufacturing are known per se and therefore need not be more specifically described.

According to this specific example, the parameters to be measured are the thicknesses $d_1$ and $d_2$ of the uppermost silicon oxide layers $L_6$ and $L_{2,6}$, respectively. It is appreciated that any other parameters of the patterned structure such as, for example, materials and their optical properties, can be measured.

Figure 2:
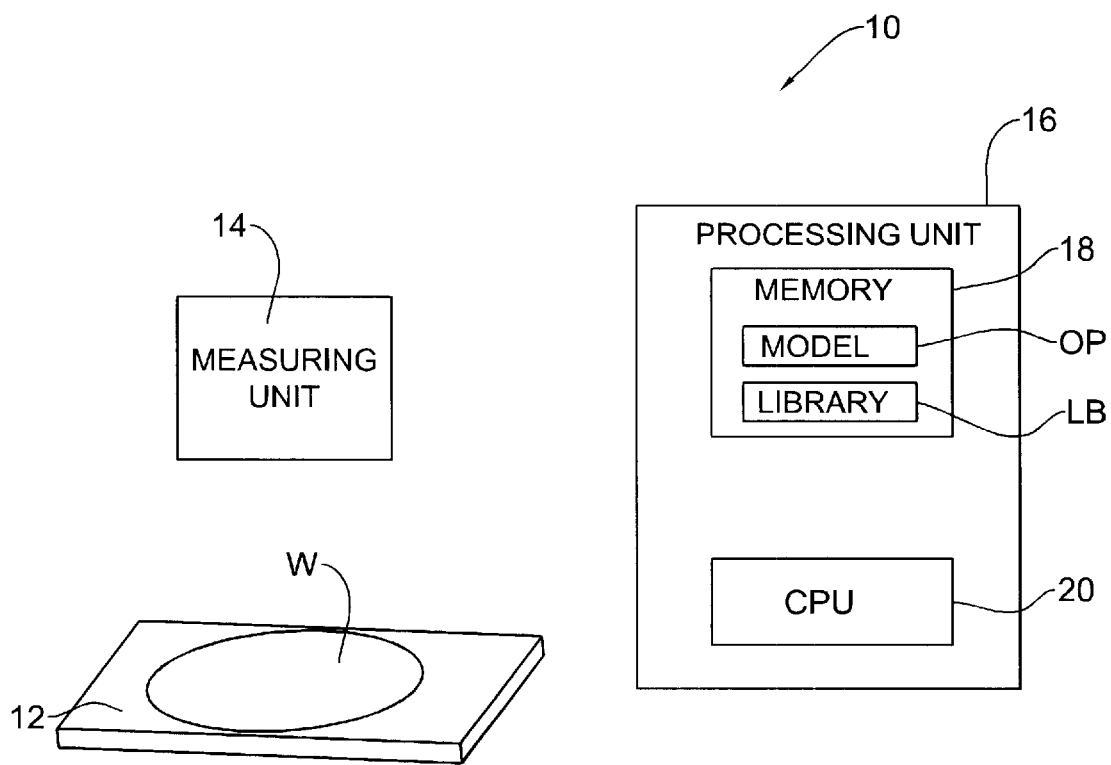
FIG. 2 schematically illustrates the main components of an apparatus according to the invention for measuring the parameters of the patterned structure of FIGS. 1A–1B.

Referring to FIG. 2, there is illustrated a system, generally designated 10, suitable to be used for the purposes of the present invention. The system 10 may represent one of the working stations of a production line (not shown), the wafers W progressing between upstream and downstream stations of the production line. The system 10 comprises a support stage 12 for supporting the wafer W under measurements, a measuring unit 14 (spectrophotometer) and a processing unit 16 connected thereto.

The construction and operation of the spectrophotometer are known per se and therefore need not be specifically described, except to note that, preferably, it is constructed similar to NovaScan 210 model commercially available from Nova Measuring Instruments Ltd.

The processing unit 16 is generally a computer device having, inter alia, a memory block 18 and a programmable block 20 (i.e., CPU). The memory block 18 serves for storing a specific optical model OP and a specific library LB (which constitutes reference data).

The optical model OP is based on the theory of interference in thin films and is designed as disclosed in the above-indicated U.S. patent, which is incorporated herein by reference. This model presents spectral response (reflectance) of the patterned article (wafer) as a function of a set of N parameters corresponding to N' characteristics of the wafer's site, which include the layers' numbers, layers' materials characteristics (i.e., optical constants n and k) and thicknesses, geometrical characteristics (lines and spaces), optical model geometric related parameters A, B, C, D and E, etc. As for the optical model geometric related parameters A, B, C, D and E, they depend on the dimensions and materials of the structure and can be determined experimentally from the actual measurements or calculated from design data obtained from the manufacturer.

Figure 3:
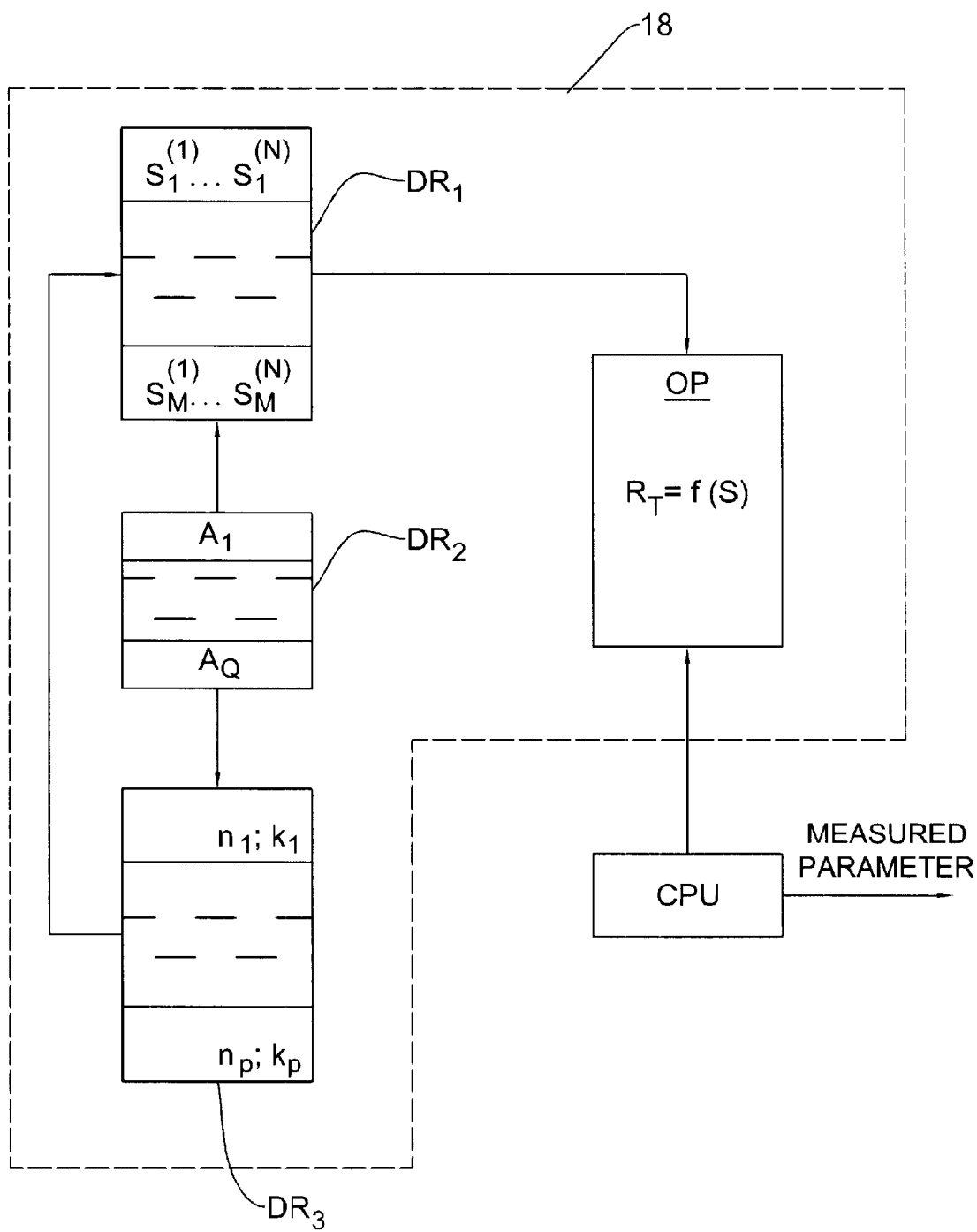
FIG. 3 illustrates a block diagram of the main features of the library design.

The library LB may have any suitable design for storing the following information. As shown in FIG. 3, more specifically illustrating the memory block 18, the library contains a data record $DR_1$ including M different sets, S, of N parameters to be transferred to the optical model OP for determining the theoretical spectrum $R_T$. These M data fields actually cover all possible examples of the stack's structures to be found in the wafers to be inspected. Additionally, the library LB includes a data record $DR_2$ containing data representative of suitable interpretation algorithms $A_1$ to $A_Q$. The block diagram of the library LB is illustrated here schematically, solely to facilitate understanding of the main features of the present invention. It should, however, be noted that the algorithms-containing data could be included into the respective data record of the parameters' set, rather than being a separate data record. Further included in the library LB (as a not-limiting example) is a data record $DR_3$ containing data representative of P optical parameters n and k. It should be noted that these parameters do not necessarily corresponds to P different materials, but the same material (e.g. TiN, polysilicon, etc.) may have different values of the same optical parameter (n and k—the index of retraction and the extinction coefficient respectively), depending on the technological process used in the wafers' manufacture. Similarly, the materials-relating information may also be included in the data record $DR_1$. The data record(s) of the library LB is prepared by applying optical measurements to a "golden" wafer, or other wafer containing all or most of the stack structures (or sites with similar geometry) of the wafer to be measured. Additionally, the data records may be prepared based on information of the feature design rules of the wafer's process, provided by the manufacturer.

Thus, the following information about each stack (site) is included in the reference data:

- algorithms suitable for performing a fitting procedure enabling calculation of the thickness or optical characteristic of uppermost or other layer(s) of the article;
- the thickness values range to be used in the fitting procedure;
- optical model geometric related parameters (characteristics), e.g., A, B, C, D and E;
- the feature width and the space between two or more adjacent features (i.e., lines and spaces);
- in the case that the site-stack is composed of locally adjacent sub-stacks, the information regarding these sub-stacks, namely materials (n and k, i.e., the index of retraction and the extinction coefficient, respectively), the nominal thickness value and its allowable tolerances towards maximal and minimal values for each layer of the sub-stack.

The interpretation algorithm is a predetermined sequence of operational steps performed on the optical model including its optimization by sequential entry of different parameters' sets, adjusting pre-determined parameters of sets within predetermined ranges for calculating the theoretical spectrum, comparison of calculated theoretical spectrum with measured one by suitable fitting procedures, such as correlation, linear regression, etc. The interpretation algorithm design does not form part of the present invention and need not be specifically described, except to note that it provides for adjusting the model parameters to obtain the best fit between the theoretical and measured spectrums.

Thus, the system 10 operates in the following manner. Initially, the "golden" wafer is measured, and data record $DR_1$ is created. Alternatively, the data record $DR_1$ or at least part thereof can be prepared based on information of the features design rules of the wafer's process provided by manufacturer. It is important to note that this operational step is performed once for a plurality of system operational cycles, thereby actually presenting a set-up procedure. As for the creation of data records. $DR_2$ and $DR_3$ and of the optical model OP, these are also parts of the set-up procedure. Generally speaking, the set-up procedure is a so-called "learning mode" for learning the technological steps of the manufacture of the patterned article of a specific kind (e.g., semiconductor wafer), materials used and layers' optical properties. It should be understood that the record $DR_1$ may be periodically updated in accordance with new wafers' structure developed for manufacture. The set-up step results can be used by a plurality of measurement systems, which may be remotely located.

Once the calibration step is completed, the system 10 is ready for measurements. Let us consider two examples of the system operation: (1) automatic recipe design preparation; and (2) automatic multi-point (multi-sites) in-line thickness measurements, i.e., mapping.

1. Recipe Design Preparation

As indicated above, the recipe design is a computer file including all necessary information, regarding a specific measurement site (stack). An operator wishes to take measurements at an arbitrarily selected site. The term "arbitrarily" signifies a site with unknown layers' structure and pattern. The measuring unit 10 is actuated for measuring light response (reflectance) of this site and generates measured data in the form of a spectrum. This data is transmitted to the processing unit 16, and enters its programmable block 18 through a suitable application program interface.

The programmable block "applies" to the library (LB in FIG. 2) for running various parameters' sets from the data record $DR_1$, and corresponding algorithms. The interpretation algorithm is a predetermined sequence of operational steps performed on the optical model. The operational steps include sequential entry of different parameters' sets, adjusting pre-determined parameters of sets within pre-determined ranges for calculating the theoretical spectrum, comparison of calculated theoretical spectrum with measured one by suitable fitting procedures, such as correlation, linear regression, etc. It should be noted, that entry of each following parameter's set is performed after completing the adjusting procedure which is terminated by criteria based decision of programmable block. A loop algorithm can perform the adjusting procedure. Different pre-determined parameters, such as number of layers, thicknesses of pre-determined layers, materials-relating information (n and k—the index of retraction and the extinction coefficient respectively) could be adjusted. The adjusting ranges and adjusting step values could be stored either in the correspondent parameter's set of defined by algorithm. Optionally, the optical model geometric related parameters (characteristics), e.g., A, B, C, D and E to be used in the adjusting procedure.

Each adjusting cycle ends with calculation of theoretical spectrum and comparison thereof with measured spectrum. Comparison or so-called "fitting procedure" between the corresponding theoretical spectrum and the measured spectrum is usually completed by adjusting the value of the parameter to be measured, e.g., thickness. Adjusting procedure for each parameters set terminated upon obtaining result of comparison conform to pre-determined criteria. For example, it could be a maximal value of goodness of fit (GOF). That value of the parameter to be measured (thickness), which corresponds to the theoretical spectrum providing the desirable (supposedly best) goodness of fit with the measured spectrum, presents the measurement results.

To locate this measurement site, a wafer alignment procedure is typically performed using pattern recognition features. The alignment may be performed prior to or after the measurements. The alignment related information possibly includes an alignment feature type and coordinates, and is stored in the recipe design file to be used for further measurements in successive dies of this or similar wafer. Thus, the recipe design is complete, and the recipe design file contains all the needed information regarding this specific site to be used for further serial measurements. It should be understood that in the similar manner, the several recipe design files could be created corresponding to different sites of the specific wafer.

It should be noted that the case may be such that, to construct an optimal recipe design, an operator first takes measurements at different arbitrarily selected sites within a die, obtains the values of a parameter to be measured (e.g. thickness or optical parameters), and then selects one or more specific sites based on manufacturing, criteria for the recipe design. For example, the operator can select the site(s) having maximal and/or minimal thickness of the uppermost layer.

2. Mapping

It should be noted that the mapping could be global" (within the entire wafer) or "local" (within the die). Let us consider each of these techniques.

2.1 Global Mapping

The case may be such that one needs to perform multi-point thickness measurements according to a predetermined "scanning" trajectory (e.g., radial) with a desired resolution (scanning step). In this case, the measurement sites (points) could be arbitrarily distributed within the dies, and accordingly, the recipe design based technique cannot be used. To this end, the above-described measurement technique is applied to each successive point by running the total reference data contained in the library, and thickness values are determined. By doing this, either the entire wafer's profiles in different directions or a global map is constructed.

2.2 Die Mapping

The case may be such that one needs to perform multi-point thickness measurements throughout a die according to a predetermined sampling distribution with a desired resolution (a scanning step). In this case, the measurement sites (points) could be arbitrarily distributed within the die, and accordingly, the recipe design based technique cannot be used. To this end, the above-described measurement technique is applied to each successive point by running the total reference data contained in the library, and thickness values are determined. By doing this, either the entire die profiles in different directions or a die map is constructed.

2.3 Local Mapping

The case may be such that one need to measure the wafer's profile in a small area, e.g., within the die. In this case, the above-described mapping procedure may be employed. Alternatively, if the wafer's structure in this area is known (i.e., supplied by the manufacture or previously determined by the recipe design preparation technique), there is no need for running the entire library, but rather at least two specific parameters' sets. As shown in FIG. 4, the die's area D typically comprises field regions $R_1$ and $R_3$ and a pattern region $R_2$ enclosed therebetween. During the scanning of this area, two corresponding parameters' sets are used for optimizing the optical model. As a result, two "best-fit" spectra correspond to, respectively, the regions $R_1$ and $R_3$ and the region $R_2$. The sequential calculations enable the correct profile of this area to be obtained. It should be noted, that for local measuring in number of measuring sites all or selected parameter's sets could be run. If the same set of parameters is appropriate for these sites, it could be applied for measuring in the following sites until desired criteria; e.g. GOF is consistent with pre-determined value. When this criterion becomes non-consistent with pre-determined value, the all or selected parameter's sets could be run again, etc.

Those skilled in the art will readily appreciate that various modifications and changes can be applied to the preferred embodiments of the invention as hereinbefore exemplified without departing from its scope defined in and by the appended claims.

What is claimed is:

1. A method for measuring at least one desired characteristic of a patterned article containing a plurality of different pattern elements located at different sites, each including a stack of layers, the method comprising the steps of:

providing an optical model based on a set of parameters corresponding to predetermined characteristics of the article, wherein said set includes inter alia parameters corresponding to geometrical characteristics of the pattern elements, said optical model being capable of generating theoretical data indicative of spectral response of the article;

preparing reference data containing a plurality of sets of parameters for at least some of said different pattern elements;

taking a spectral measurement of light response at a selected site of said patterned article and generating measured data;

optimizing the optical model by varying said parameters' sets; and analyzing the theoretical spectral responses obtained through the optimized optical model and from the measured data, in order to determine therefrom said at least one desired characteristic.

2. The method according to claim 1, wherein said analyzing includes adjusting at least one parameter corresponding to said at least one desired characteristic.

3. The method according to claim 2, wherein said reference data is prepared by applying spectral measurements to a test article including substantially all of said pattern elements contained in the patterned article.

4. The method according to claim 2, wherein said reference data is prepared by applying information of feature design rules and obtaining parameter sets.

5. The method according to claim 2, wherein said reference data is prepared by applying information of layer stack and obtaining parameter sets.

6. The method according to claim 2, wherein said reference data is prepared by applying information of feature design rules and layer stack and obtaining parameter sets.

7. The method according to claim 2, wherein said reference data includes information on indices of refraction, n, and extinction coefficient, k, of the stack layers.

8. The method according to claim 7, wherein the step of optimizing the optical model includes adjusting parameters corresponding to the index of refraction, n, and/or extinction coefficient, k.

9. The method according to claim 8, wherein said parameters corresponding to the indices of refraction, n, and extinction coefficients, k, of the stack layers are included within said sets of parameters.

10. The method according to claim 7, wherein said reference data further comprises a plurality of algorithms for performing the optimization of said optical model and determining the desired characteristic.

11. The method according to claim 10, wherein the reference data preparation comprises selecting the algorithm suitable for performing the optimization of said optical model and determining the desired characteristic as related to the corresponding parameters' set.

12. The method according to claim 1, wherein said desired characteristic is determined using parameters' set that provides the theoretical spectral responses most closely fitting the measured data.

13. The method according to claim 1, wherein the desired characteristic is thickness of at least one layer of the stack.

14. The method according to claim 1, wherein the desired characteristic is an index of refraction, n, of at least one stack layer.

15. The method according to claim 1, wherein the desired characteristic is an extinction coefficient, k, of at least one stack layer.

16. The method according to claim 1, wherein the desired characteristics are an index of refraction, n, and an extinction coefficient, k, of at least one stack layer.

17. A method for thickness mapping of a patterned article containing a plurality of different pattern elements located at different sites, each including a stack of layers, the method comprising the steps of:

providing an optical model based on a set of parameters corresponding to predetermined characteristics of the article, wherein said set includes inter alia parameters corresponding to geometrical characteristics of the pattern elements, said optical model being capable of generating theoretical data indicative of spectral response of the article;

preparing reference data containing a plurality of sets of parameters for at least some of said different pattern elements;

taking spectral measurements of light response at selected sites of said patterned article and generating measured data;

optimizing the optical model by varying said parameters' sets; and analyzing the theoretical spectral responses obtained through the optimized optical model and from the measured data, in order to determine therefrom the thicknesses at the selected sites, and generating the thickness map.

18. The method according to claim 17, wherein the thickness of the article is determined using parameters' set that provides the theoretical spectral responses most closely fitting the measured data.

19. The method according to claim 17, wherein said thickness is that of at least one layer of the stack.

20. A method for determining a surface profile of a patterned article containing a plurality of different pattern elements located at different sites, each including a stack of layers, the method comprising the steps of;

providing an optical model based on a set of parameters corresponding to predetermined characteristics of the article, wherein said set includes inter alia parameters corresponding to geometrical characteristics of the pattern elements, said optical model being capable of generating theoretical data indicative of spectral response of the article;

preparing reference data containing a plurality of sets of parameters for at least some of said different pattern elements;

taking spectral measurements of light response at selected sites of said patterned article and generating measured data;

optimizing the optical model by varying said parameters' sets; and analyzing the theoretical spectral responses obtained through the optimization and the measured data, in order to determine therefrom the desired characteristics at the selected sites, and calculating the surface profile from said characteristics.

21. The method according to claim 20, wherein said desired characteristics are thicknesses of at least one layer of the stack.

22. The method according to claim 20, wherein the desired characteristics are determined using parameters' set providing theoretical spectral responses most closely fitting the measured data.

23. The method according to claim 20, wherein said optimizing of the optical model includes the step of varying predetermined sets of parameters.

24. The method according to claim 23, wherein at least two of the variable predetermined sets of parameters correspond to characteristics of the selected sites of at least two types.

25. The method according to claim 20, wherein said patterned article is a semiconductor wafer.

26. The method according to claim 25, further comprising the step of defining a location of the selected measuring site, and applying further measurements in a similar site located in at least one different die.

27. The method according to claims 20, wherein said patterned article is a semiconductor wafer and the selected sites are located within the same die of the wafer.

28. The method according to claim 20, wherein said further measurements use the set of parameters providing theoretical spectral responses most closely fitting the measured data.

29. A system for optical measuring at least one desired characteristic of a patterned article containing a plurality of pattern elements located at different sites, each including a stack of layers, the system comprising:

a measuring unit including a spectrophotometer that determines spectral response of a measurement site on the article and generates spectral measured data;

a memory for storing an optical model based on a set of parameters corresponding to predetermined characteristics of the article, wherein said set includes inter alia parameters corresponding to geometrical characteristics of the pattern elements and said optical model is capable of generating theoretical data indicative of spectral response of the article, said memory storing a reference data containing a plurality of sets of parameters for at least some of said different pattern element;

a processing unit coupled to the measuring unit for receiving the spectral measured data, optimizing the optical model by various parameters' sets contained in the reference data, analyzing the theoretical spectral responses obtained through the optimization and the measured data in order to determine therefrom said at least one desired characteristic.

30. The system according to claim 29, wherein said desired characteristic is thickness.

31. The system according to claim 29, wherein said desired characteristic is an index of refraction, n.

32. The system according to claim 29, wherein said desired characteristic is an extinction coefficient, k.

33. The system according to claim 29, wherein the processing unit operates to adjust at least one parameter corresponding to said at least one desired characteristic.

34. The system according to claim 29, wherein said reference data is prepared by applying spectral measurements to a test article including substantially all of the different pattern elements contained in the patterned article.

35. The system according to claim 29, wherein said reference data is prepared by applying information of the feature design rules and obtaining parameter sets.

36. The system according to claim 29, wherein said reference data is prepared by applying information of layer stack and obtaining parameter sets.

37. The system according to claim 29, wherein said reference data includes information on indices of refraction, n, and extinction coefficient, k, of the stack layers.

38. The system according to claim 29, wherein said reference data further comprises a plurality of algorithms suitable for performing the optimization of said optical model and determining the desired characteristic.

39. The system according to claim 29, wherein said parameters corresponding to the indices of refraction, n, and extinction coefficients, k, of the stack layers are included within said sets of parameters.

40. The system according to claim 29, and further comprising a pattern recognition utility.

41. The system according to claim 29, and further comprising an auto-focusing assembly.

42. An optical profilometer for determining a surface profile of a patterned article containing a plurality of pattern elements located at different sites, each including a stack of layers, the optical profilometer comprising:

a measuring unit including a spectrophotometer that determines spectral response of a measurement site on the article and generates spectral measured data;

a memory for storing an optical model based on a set of parameters corresponding to predetermined characteristics of the article, wherein said set includes inter alia parameters corresponding to geometrical characteristics of the pattern elements, and said optical model is capable of generating theoretical data indicative of spectral response of the article, said memory storing a reference data containing a plurality of sets of parameters for at least some of said different pattern element; and a processing unit coupled to the measuring unit for receiving the spectral measured data, optimizing the optical model by various parameters' sets, analyzing the theoretical spectral responses obtained through the optimization and the measured data, in order to determine therefrom the desired characteristic at selected sites, and calculating the surface profile from said characteristic.

* * * * *